United States Patent
King

(10) Patent No.: US 8,669,799 B1
(45) Date of Patent: Mar. 11, 2014

(54) DUTY CYCLE CALIBRATION OF A CLOCK SIGNAL

(75) Inventor: Wilfred Wee Kee King, Kuching (MY)

(73) Assignee: Altera Corporation, San Jose, CA (US)

( * ) Notice: Subject to any disclaimer, the term of this patent is extended or adjusted under 35 U.S.C. 154(b) by 13 days.

(21) Appl. No.: 13/455,974

(22) Filed: Apr. 25, 2012

(51) Int. Cl.
*H03K 3/017* (2006.01)

(52) U.S. Cl.
USPC .......................................... 327/175; 327/172

(58) Field of Classification Search
None
See application file for complete search history.

(56) References Cited

U.S. PATENT DOCUMENTS

| | | | |
|---|---|---|---|
| 5,572,158 A * | 11/1996 | Lee et al. | 327/175 |
| 6,426,660 B1 | 7/2002 | Ho et al. | |
| 6,593,789 B2 | 7/2003 | Atallah et al. | |
| 7,015,739 B2 * | 3/2006 | Lee et al. | 327/175 |
| 7,199,634 B2 * | 4/2007 | Cho et al. | 327/175 |
| 7,501,870 B2 * | 3/2009 | Choi et al. | 327/175 |
| 7,525,359 B2 | 4/2009 | Kim | |
| 7,863,958 B2 | 1/2011 | Boerstler et al. | |
| 8,106,697 B2 * | 1/2012 | Chang et al. | 327/175 |
| 8,324,949 B2 * | 12/2012 | Cherkassky et al. | 327/175 |
| 2009/0128207 A1 * | 5/2009 | Chang et al. | 327/175 |
| 2011/0291725 A1 * | 12/2011 | Shin | 327/175 |
| 2012/0007647 A1 * | 1/2012 | Shim et al. | 327/175 |

OTHER PUBLICATIONS

U.S. Appl. No. 13/083,431, filed Apr. 8, 2011, entitled "Techniques for Reducing Duty Cycle Distortion in Periodic Signals."

* cited by examiner

*Primary Examiner* — Cassandra Cox
(74) *Attorney, Agent, or Firm* — Steven J. Cahill

(57) ABSTRACT

A circuit includes a duty cycle calibration circuit, a duty cycle detection circuit, and a feedback control circuit. The duty cycle calibration circuit is operable to generate a first clock signal based on a second clock signal using an inverter and a first transistor. The first transistor is coupled in parallel with a second transistor in the inverter. The duty cycle detection circuit is operable to generate a voltage signal that varies based on changes in a duty cycle of the first clock signal. The feedback control circuit is operable to generate a control signal based on the voltage signal. The duty cycle calibration circuit is operable to control the duty cycle of the first clock signal based on the control signal controlling a current through the first transistor.

26 Claims, 8 Drawing Sheets

US 8,669,799 B1

DUTY CYCLE CALIBRATION OF A CLOCK SIGNAL

TECHNICAL FIELD

The present invention relates to electronic circuits, and more particularly, to duty cycle calibration of a clock signal.

BACKGROUND

The duty cycle of a periodic signal refers to the ratio between the duration of a logic high state in a period of the periodic signal and the duration of the period of the periodic signal. A periodic signal is also referred to as a clock signal.

Duty cycle distortion (DCD) causes the duty cycle of a clock signal to vary from an ideal value. For example, DCD may cause the duty cycle of a clock signal to be greater than or less than an ideal value of 50%. DCD in a clock signal may be caused, for example, by variations between the pull-up currents and the pull-down currents through transistors in a circuit that generates the clock signal. DCD in the clock signal is dependent on variations in the process, the supply voltage, and the temperature of the circuit that generates the clock signal.

Many data transmission systems use clock signals to transmit and receive data signals. Duty cycle distortion (DCD) in a clock signal used by a data transmitter may cause the data transmitter to generate jitter in a data signal. Jitter in the data signal may cause a data receiver that receives the data signal to sample incorrect data bits in the data signal.

BRIEF SUMMARY

According to some embodiments, a circuit includes a duty cycle calibration circuit, a duty cycle detection circuit, and a feedback control circuit. The duty cycle calibration circuit is operable to generate a first clock signal based on a second clock signal using an inverter and a first transistor. The first transistor is coupled in parallel with a second transistor in the inverter. The duty cycle detection circuit is operable to generate a voltage signal that varies based on changes in a duty cycle of the first clock signal. The feedback control circuit is operable to generate a control signal based on the voltage signal. The duty cycle calibration circuit is operable to control the duty cycle of the first clock signal based on the control signal controlling a current through the first transistor.

Various objects, features, and advantages of the present invention will become apparent upon consideration of the following detailed description and the accompanying drawings.

DETAILED DESCRIPTION

Figure 1:
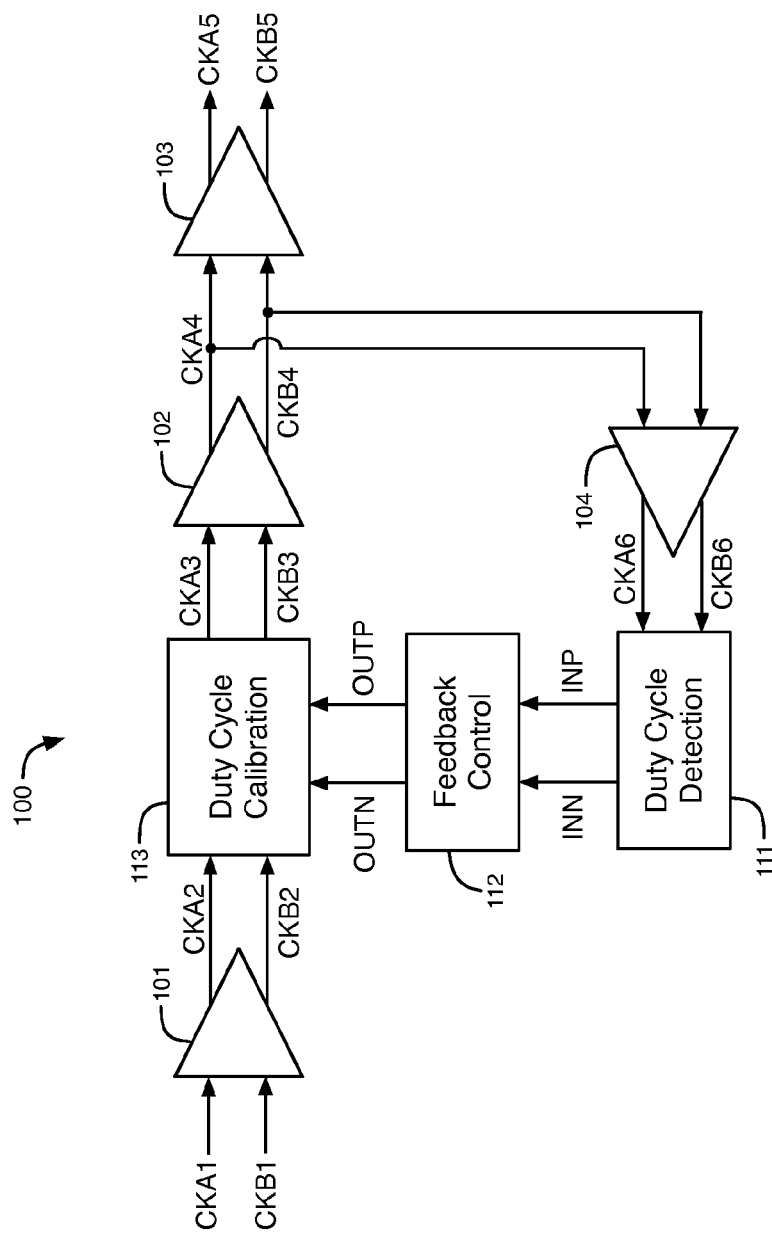
FIG. 1 illustrates an example of a duty cycle correction circuit, according to an embodiment of the present invention.

FIG. 1 illustrates an example of a duty cycle correction circuit 100, according to an embodiment of the present invention. Duty cycle correction circuit 100 includes four differential clock buffer circuits 101-104, duty cycle detection circuit 111, feedback control circuit 112, and duty cycle calibration circuit 113. Circuit 100 may be in an integrated circuit, such as a programmable logic integrated circuit or an application specific integrated circuit.

Two complementary periodic input signals CKA1 and CKB1 are provided to inputs of differential clock buffer circuit 101. The difference between periodic input signal CKA1 and periodic input signal CKB1 equals a first differential clock signal. Buffer circuit 101 buffers the first differential clock signal indicated by periodic input signals CKA1 and CKB1 to generate complementary periodic signals CKA2 and CKB2 at its outputs. The difference between periodic signal CKA2 and periodic signal CKB2 equals a second differential clock signal. Periodic signals CKA2 and CKB2 are provided to inputs of duty cycle calibration circuit 113.

Duty cycle calibration circuit 113 buffers the second differential clock signal indicated by signals CKA2 and CKB2 to generate complementary periodic signals CKA3 and CKB3 at its outputs. The difference between periodic signal CKA3 and periodic signal CKB3 equals a third differential clock signal. Duty cycle calibration circuit 113 controls the duty cycle of the third differential clock signal indicated by signals CKA3 and CKB3 based on control signals OUTP and OUTN, as described below with respect to the embodiments of FIGS. 3-5.

Buffer circuit 102 buffers the third differential clock signal indicated by signals CKA3 and CKB3 to generate complementary periodic signals CKA4 and CKB4 at its outputs. The difference between signal CKA4 and signal CKB4 equals a fourth differential clock signal. Buffer circuit 103 buffers the fourth differential clock signal indicated by signals CKA4 and CKB4 to generate complementary periodic signals CKA5 and CKB5 at its outputs. The difference between signal CKA5 and signal CKB5 equals a fifth differential clock signal. The fifth differential clock signal indicated by signals CKA5 and CKB5 is the output clock signal of circuit 100.

Buffer circuit 104 buffers the fourth differential clock signal indicated by signals CKA4 and CKB4 to generate complementary periodic signals CKA6 and CKB6 at its outputs. The difference between signal CKA6 and signal CKB6 equals a sixth differential clock signal. Signals CKA6 and CKB6 are provided to inputs of duty cycle detection circuit 111. Duty cycle detection circuit 111 includes a differential low pass filter circuit that filters periodic signals CKA6 and CKB6 to generate voltage signals INP and INN. The difference between the voltage of signal INP and the voltage of signal INN is a differential voltage that is proportional to the duty cycle of the sixth differential clock signal indicated by signals CKA6 and CKB6.

Voltage signals INP and INN are provided to inputs of feedback control circuit 112. In an embodiment, feedback control circuit 112 includes a differential operational amplifier circuit that amplifies the difference between the voltages of input voltage signals INP and INN to generate output voltage signals OUTP and OUTN. Output voltage signals OUTP and OUTN are provided to inputs of duty cycle calibration circuit 113. Voltage signals OUTP and OUTN indicate a differential voltage signal. Duty cycle calibration circuit 113 adjusts the duty cycle of the third differential clock signal indicated by signals CKA3 and CKB3 based on changes in the differential voltage indicated by voltage signals OUTP and OUTN.

Duty cycle correction circuit 100 functions as a negative feedback loop control circuit. Duty cycle correction circuit 100 drives the duty cycle of the fifth differential clock signal (i.e., CKA5–CKB5) to 50%. When the duty cycle of the fifth differential clock signal is greater than 50%, circuit 100 decreases the duty cycle of the fifth differential clock signal to 50%. When the duty cycle of the fifth differential clock signal is less than 50%, circuit 100 increases the duty cycle of the fifth differential clock signal to 50%. Duty cycle correction circuit 100 responds continuously in real time to changes in the duty cycle of the first differential clock signal to adjust the duty cycle of the fifth differential clock signal to 50%. If duty cycle correction circuit 100 is used to generate a clock signal for a data transmission system, duty cycle correction circuit 100 can correct changes in the duty cycle of the clock signal without disrupting the transmission of data.

Figure 2:
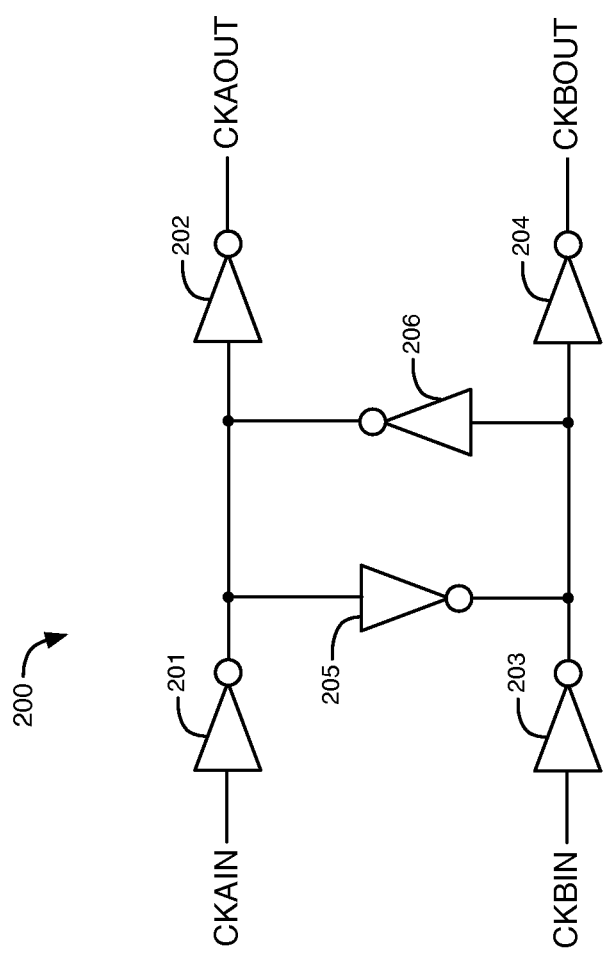
FIG. 2 illustrates an example of a differential clock buffer circuit, according to an embodiment of the present invention.

FIG. 2 illustrates an example of a differential clock buffer circuit 200, according to an embodiment of the present invention. Differential clock buffer circuit 200 includes six complementary metal oxide semiconductor (CMOS) inverter circuits 201-206. Inverters 201 and 202 are coupled together in series. Inverters 203 and 204 are coupled together in series. Inverters 205 and 206 are cross-coupled between the outputs of inverters 201 and 203 and the inputs of inverters 202 and 204 as shown in FIG. 2. Each of inverter circuits 201-206 is a buffer circuit.

A first periodic input signal CKAIN is provided to an input of inverter 201, and a second periodic input signal CKBIN is provided to an input of inverter 203. The difference between signal CKAIN and signal CKBIN equals a differential input clock signal. Inverter 202 generates a first periodic output signal CKAOUT at its output, and inverter 204 generates a second periodic output signal CKBOUT at its output. The difference between signal CKAOUT and signal CKBOUT equals a differential output clock signal. Differential clock buffer circuit 200 buffers the differential input clock signal indicated by signals CKAIN and CKBIN to generate the differential output clock signal indicated by signals CKAOUT and CKBOUT.

Ideally, periodic input signals CKAIN and CKBIN each have a 50% duty cycle and are 180° out of phase with each other. One type of DCD can cause periodic input signal CKAIN to have a phase offset with respect to periodic input signal CKBIN that is greater than or less than 180°. If signals CKAIN and CKBIN have a phase offset that is greater than or less than 180°, and the magnitude of the phase offset of signals CKAIN and CKBIN minus 180° is less than a phase margin (e.g., about 5-10% of their periods), cross-coupled inverters 205-206 in differential clock buffer circuit 200 cause the phase offset of periodic output signals CKAOUT and CKBOUT to be 180°. Cross-coupled inverters 205-206 cause differential clock buffer circuit 200 to generate periodic output signal CKAOUT based on both of periodic input signals CKAIN and CKBIN. Cross-coupled inverters 205-206 also cause differential clock buffer circuit 200 to generate periodic output signal CKBOUT based on both of periodic input signals CKAIN and CKBIN.

Thus, if signals CKAIN and CKBIN are offset by more or less than 180° within the phase margin, differential clock buffer circuit 200 causes the voltage midpoint of each rising edge in output signal CKAOUT to occur at about the same time as the voltage midpoint of a corresponding falling edge in output signal CKBOUT. Also, if signals CKAIN and CKBIN are offset by more or less than 180° within the phase margin, differential clock buffer circuit 200 causes the voltage midpoint of each falling edge in output signal CKAOUT to occur at about the same time as the voltage midpoint of a corresponding rising edge in output signal CKBOUT. As a result, the duty cycle of output signal CKAOUT plus the duty cycle of output signal CKBOUT equals 100%.

In an embodiment of duty cycle correction circuit 100, each of the four differential clock buffer circuits 101-104 includes an instance of differential clock buffer circuit 200. According to this embodiment, circuit 100 includes four differential clock buffer circuits 200 that correspond to differential clock buffer circuits 101-104. For buffer circuit 101, signals CKAIN, CKBIN, CKAOUT, and CKBOUT in FIG. 2 are signals CKA1, CKB1, CKA2, and CKB2, respectively, in FIG. 1. For buffer circuit 102, signals CKAIN, CKBIN, CKAOUT, and CKBOUT in FIG. 2 are signals CKA3, CKB3, CKA4, and CKB4, respectively, in FIG. 1. For buffer circuit 103, signals CKAIN, CKBIN, CKAOUT, and CKBOUT in FIG. 2 are signals CKA4, CKB4, CKA5, and CKB5, respectively, in FIG. 1. For buffer circuit 104, signals CKAIN, CKBIN, CKAOUT, and CKBOUT in FIG. 2 are signals CKA4, CKB4, CKA6, and CKB6, respectively, in FIG. 1.

Figure 3:
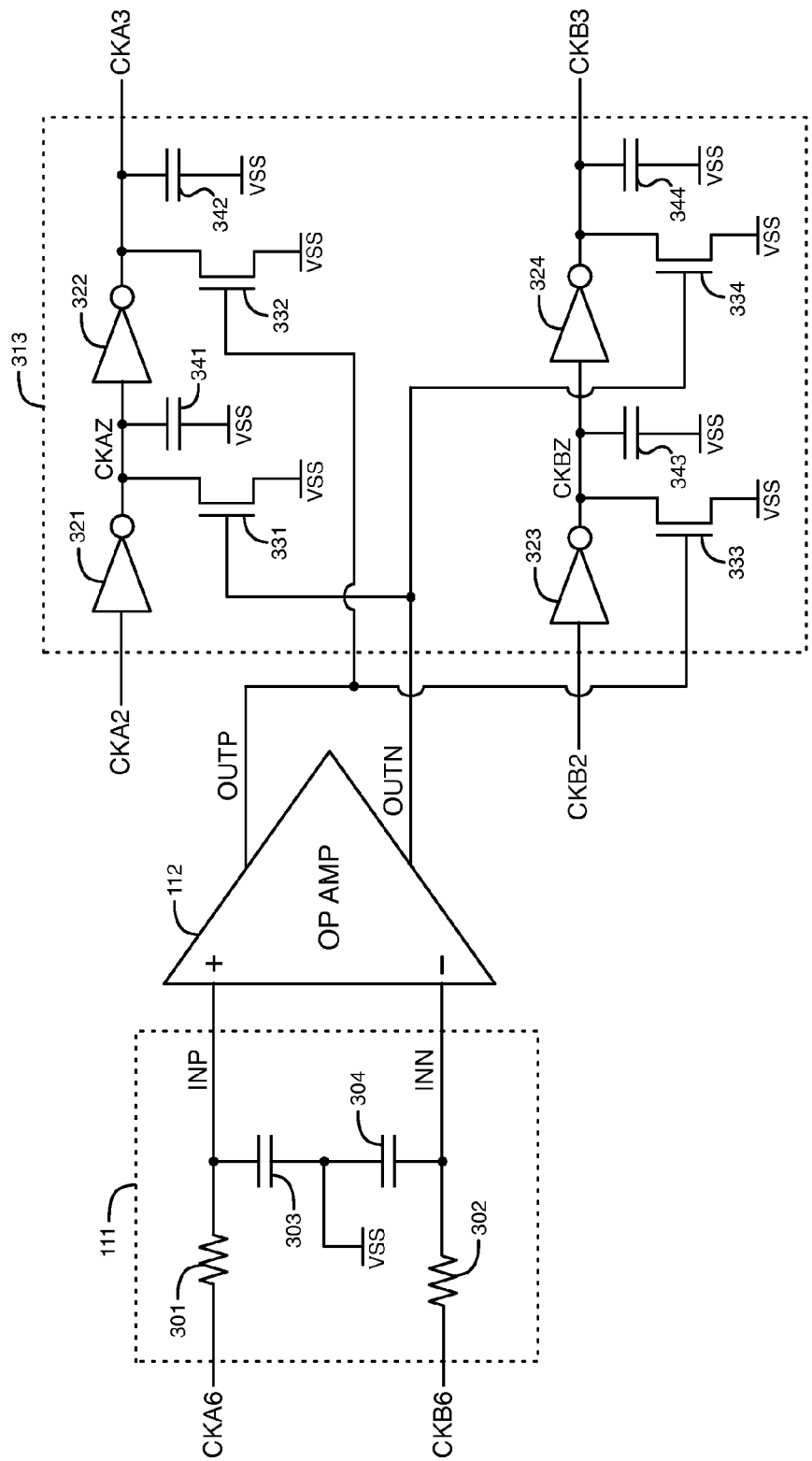
FIG. 3 illustrates an example of the duty cycle detection circuit, an example of the feedback control circuit, and a first example of the duty cycle calibration circuit of FIG. 1, according to an embodiment of the present invention.

FIG. 3 illustrates examples of duty cycle detection circuit 111, feedback control circuit 112, and a duty cycle calibration circuit 313, according to an embodiment of the present invention. Duty cycle calibration circuit 313 is a first embodiment of duty cycle calibration circuit 113 shown in FIG. 1.

Duty cycle detection circuit 111 includes resistors 301-302 and capacitors 303-304. Feedback control circuit 112 is a differential operational amplifier in the embodiment of FIG. 3. Duty cycle calibration circuit 313 includes inverter circuits 321-324, n-channel metal oxide semiconductor field-effect transistors (MOSFETs) 331-334, and loading capacitors 341-344. According to various embodiments, inverter circuits 321-324 may be CMOS inverter circuits or other types of inverter circuits. Each of the capacitors 341-344 is coupled to a node at a ground voltage VSS. In an alternative embodiment of duty cycle calibration circuit 313, loading capacitors 341-344 are removed, and the parasitic capacitances of inverters 321-324 and transistors 331-334 function as the loading capacitors.

In the embodiment of FIG. 3, duty cycle detection circuit 111 is a differential low pass filter circuit. Both of capacitors 303 and 304 are coupled to a node that is at ground voltage VSS. Resistor 301 is coupled to capacitor 303 to form a first low pass filter, and resistor 302 is coupled to capacitor 304 to form a second low pass filter, as shown in FIG. 3. Periodic signals CKA6 and CKB6 are provided to terminals of resistors 301 and 302, respectively.

Resistor 301 and capacitor 303 filter high frequency components of periodic signal CKA6 to generate voltage signal INP. Resistor 302 and capacitor 304 filter high frequency components of periodic signal CKB6 to generate voltage signal INN. The relationship between each of voltages INP and INN and the duty cycle of the sixth differential clock signal is shown in equations (1) and (2) below.

$$INP = VCC \times DC \tag{1}$$

$$INN = VCC \times (1-DC) \tag{2}$$

In equations (1) and (2), DC is the duty cycle of the sixth differential clock signal or the duty cycle of signal CKA6, and VCC is a supply voltage. As mentioned above, the sixth differential clock signal equals the difference between signals CKA6 and CKB6 (i.e., CKA6−CKB6). Current is provided from supply voltage VCC to clock buffer circuits 101-104, feedback control circuit 112, and duty cycle calibration circuit 113.

The difference between voltage signal INP and voltage signal INN is a DC (direct current) differential analog voltage signal that indicates the duty cycle of the sixth differential clock signal. The voltage difference between signals INP and INN varies based on changes in the duty cycle of the sixth differential clock signal. The difference between the voltage of INP and the voltage of INN is not dependent on variations in supply voltage VCC. The resistances of resistors 301-302 and the capacitances of capacitors 303-304 are inversely proportional to the frequencies of the differential clock signals. Thus, if the frequencies of the differential clock signals are increased, the resistances of resistors 301-302 and the capacitances of capacitors 303-304 may be reduced.

Voltage signals INP and INN are provided to the non-inverting (+) and inverting (−) inputs of operational amplifier circuit 112, respectively, as shown in FIG. 3. Operational amplifier circuit 112 amplifies the difference between the voltage of signal INP and the voltage of signal INN (i.e., INP−INN) to generate a differential output voltage signal. The differential output voltage signal of operational amplifier circuit 112 equals the voltage of output signal OUTP minus the voltage of output signal OUTN (i.e., OUTP−OUTN), as shown in equation (3) below. In equation (3), G is the gain of amplifier circuit 112.

$$OUTP - OUTN = G \times (INP - INN) \tag{3}$$

Signals OUTP and OUTN are generated at outputs of operational amplifier circuit 112, as shown in FIG. 3. The output signal OUTP of operational amplifier circuit 112 is provided to the gates of n-channel transistors 332 and 333. The output signal OUTN of operational amplifier circuit 112 is provided to the gates of n-channel transistors 331 and 334. Because input signals INP and INN are DC voltages, operational amplifier circuit 112 and transistors 331-334 may be low-speed circuits.

Transistor 331 is coupled between the output of inverter circuit 321 and a node at ground voltage VSS. Transistor 332 is coupled between the output of inverter circuit 322 and a node at ground voltage VSS. Transistor 333 is coupled between the output of inverter circuit 323 and a node at ground voltage VSS. Transistor 334 is coupled between the output of inverter circuit 324 and a node at ground voltage VSS.

Periodic signal CKA2 is provided to an input of inverter circuit 321. Inverter circuit 321 inverts the voltage logic state of periodic signal CKA2 to generate a periodic signal CKAZ at its output. Periodic signal CKAZ is provided to the input of inverter circuit 322. Inverter circuit 322 inverts the voltage logic state of periodic signal CKAZ to generate periodic signal CKA3 at its output.

Periodic signal CKB2 is provided to an input of inverter circuit 323. Inverter circuit 323 inverts the voltage logic state of periodic signal CKB2 to generate a periodic signal CKBZ at its output. Periodic signal CKBZ is provided to the input of inverter circuit 324. Inverter circuit 324 inverts the voltage logic state of periodic signal CKBZ to generate periodic signal CKB3 at its output. Inverters 321-324 buffer their periodic output signals.

Operational amplifier circuit 112 sets the voltages of signals OUTP and OUTN to control the duty cycles of periodic signals CKA3 and CKB3. Thus, operational amplifier circuit 112 controls the duty cycle of the third differential clock signal indicated by signals CKA3 and CKB3.

As discussed above, duty cycle correction circuit 100 drives the duty cycle of the fifth differential clock signal to 50%. In response to the sixth differential clock signal (i.e., CKA6−CKB6) having a duty cycle of 50%, duty cycle detection circuit 111 causes the differential voltage INP−INN to be zero volts. When the differential voltage INP−INN equals zero volts, operational amplifier circuit 112 maintains signals OUTP and OUTN at constant voltages.

Duty cycle detection circuit 111 causes the differential voltage INP−INN to be greater than zero volts in response to the duty cycle of the sixth differential clock signal being greater than 50%. Duty cycle detection circuit 111 causes the differential voltage INP−INN to be less than zero volts in response to the sixth differential clock signal having a duty cycle that is less than 50%.

The duty cycle of a clock signal may vary in response to variations in the temperature, supply voltage, and process of the circuit that generates the clock signal. Duty cycle correction circuit 100 continuously corrects changes in the duty cycle of the fifth differential clock signal in real time that are caused by changes in the temperature, the process, and the supply voltage of the circuitry that generates the clock signals shown in FIG. 1.

The duty cycles of the fifth and sixth differential clock signals in circuit 100 increase in response to an increase in the duty cycle of the first differential clock signal. Duty cycle detection circuit 111 increases differential voltage INP−INN in response to the duty cycle of the sixth differential clock signal increasing. Operational amplifier circuit 112 increases the voltage difference between signals OUTP and OUTN (i.e., OUTP−OUTN) in response to the differential voltage INP−INN increasing. Operational amplifier circuit 112 may increase the voltage difference OUTP−OUTN by increasing the voltage of signal OUTP and/or by decreasing the voltage of signal OUTN.

In response to operational amplifier circuit 112 increasing the voltage of signal OUTP, the currents through transistors 332-333 increase. After the current through transistor 332 increases, the durations of the rising edges of periodic signal CKA3 increase, and the durations of the falling edges of periodic signal CKA3 decrease. After the current through transistor 333 increases, the durations of the rising edges of periodic signal CKBZ increase, and the durations of the falling edges of periodic signal CKBZ decrease. In response to these changes in the rising and falling edges of signal CKBZ, the durations of the falling edges of periodic signal CKB3 increase and the durations of the rising edges of periodic signal CKB3 decrease. As a result, increasing voltage OUTP causes the duty cycle of the third differential clock signal (i.e., CKA3−CKB3) to decrease.

In response to operational amplifier circuit 112 decreasing the voltage of signal OUTN, the currents through transistors 331 and 334 decrease. After the current through transistor 331 decreases, the durations of the rising edges of periodic signal CKAZ decrease, and the durations of the falling edges of periodic signal CKAZ increase. In response to these changes in the rising and falling edges of signal CKAZ, the durations of the falling edges of periodic signal CKA3 decrease and the durations of the rising edges of periodic signal CKA3 increase. After the current through transistor 334 decreases, the durations of the rising edges of periodic signal CKB3 decrease, and the durations of the falling edges of periodic signal CKB3 increase. As a result, the duty cycle of the third differential clock signal (i.e., CKA3−CKB3) decreases.

Buffer circuits 102-104 decrease the duty cycles of the fourth, fifth, and sixth differential clock signals, respectively, in response to the duty cycle of the third differential clock signal decreasing. Circuit 100 decreases the duty cycles of the third, fourth, fifth, and sixth differential clock signals until the duty cycle of the sixth differential clock signal equals 50%. When the duty cycle of the sixth differential clock signal equals 50%, circuit 100 maintains the duty cycles of the third, fourth, fifth, and sixth differential clock signals constant at 50%.

The duty cycles of the fifth and sixth differential clock signals in circuit 100 decrease in response to a decrease in the duty cycle of the first differential clock signal. Duty cycle detection circuit 111 decreases the differential voltage INP−INN in response to the duty cycle of the sixth differential clock signal decreasing. Operational amplifier circuit 112 decreases the voltage difference between signals OUTP and OUTN (i.e., OUTP−OUTN) in response to the differential voltage INP−INN decreasing. Operational amplifier circuit 112 decreases the voltage difference between signals OUTP and OUTN by decreasing the voltage of signal OUTP and/or increasing the voltage of signal OUTN.

In response to operational amplifier circuit 112 decreasing the voltage of signal OUTP, the currents through transistors 332-333 decrease. After the current through transistor 332 decreases, the durations of the rising edges of periodic signal CKA3 decrease, and the durations of the falling edges of periodic signal CKA3 increase. After the current through transistor 333 decreases, the durations of the rising edges of periodic signal CKBZ decrease, and the durations of the falling edges of periodic signal CKBZ increase. In response to these changes in the rising and falling edges of signal CKBZ, the durations of the falling edges of periodic signal CKB3 decrease and the durations of the rising edges of periodic signal CKB3 increase. As a result, the duty cycle of the third differential clock signal (i.e., CKA3−CKB3) increases. Buffer circuits 102-104 increase the duty cycles of the fourth, fifth, and sixth differential clock signals, respectively, in response to the duty cycle of the third differential clock signal increasing.

In response to operational amplifier circuit 112 increasing the voltage of signal OUTN, the currents through transistors 331 and 334 increase. After the current through transistor 331 increases, the durations of the rising edges of periodic signal CKAZ increase, and the durations of the falling edges of periodic signal CKAZ decrease. In response to these changes in the rising and falling edges of signal CKAZ, the durations of the falling edges of periodic signal CKA3 increase and the durations of the rising edges of periodic signal CKA3 decrease. After the current through transistor 334 increases, the durations of the rising edges of periodic signal CKB3 increase, and the durations of the falling edges of periodic signal CKB3 decrease. As a result, the duty cycle of the third differential clock signal (i.e., CKA3−CKB3) increases. Circuit 100 increases the duty cycles of the third, fourth, fifth, and sixth differential clock signals until the duty cycle of the sixth differential clock signal equals 50%.

Figure 4:
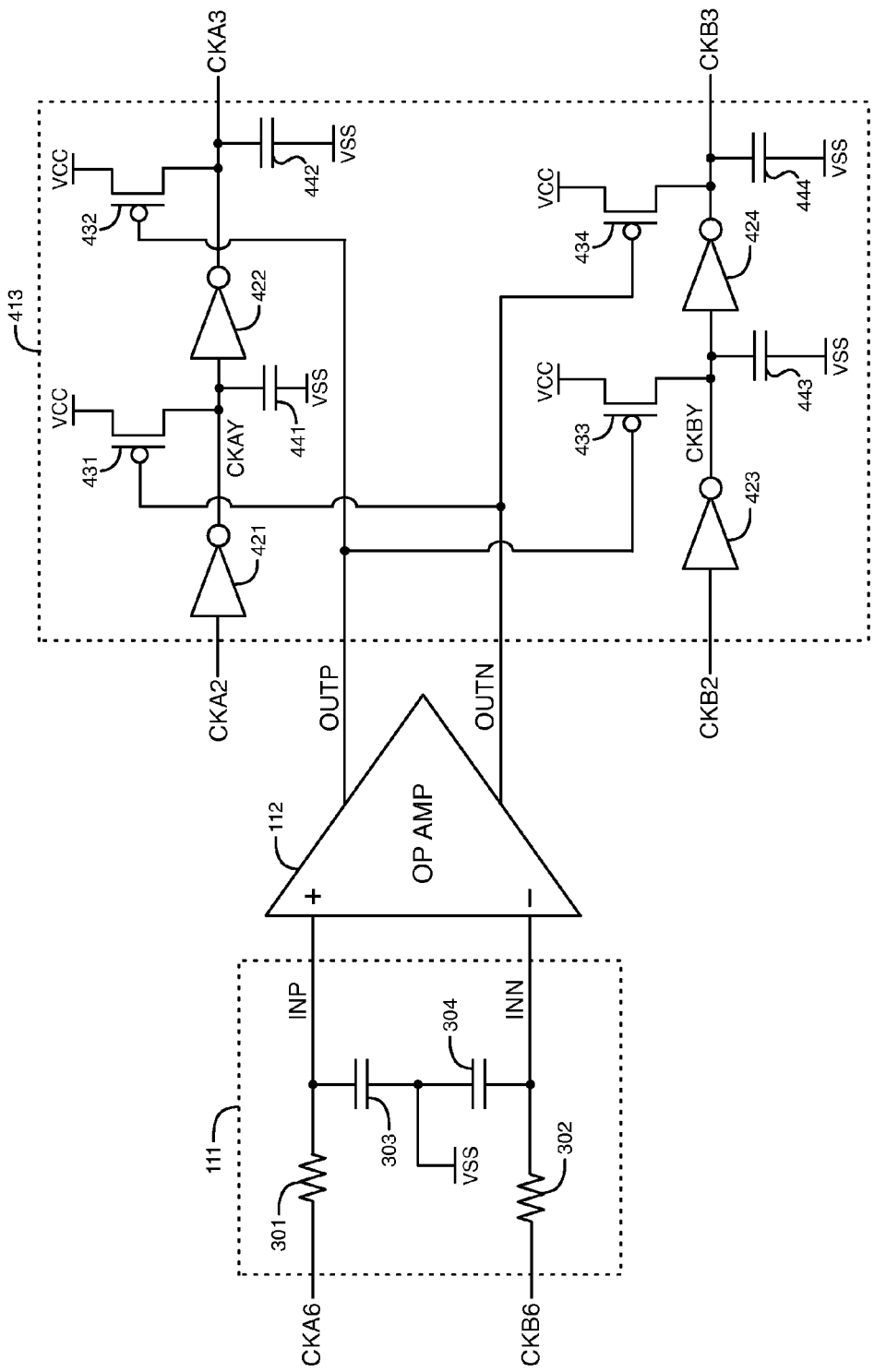
FIG. 4 illustrates an example of the duty cycle detection circuit, an example of the feedback control circuit, and a second example of the duty cycle calibration circuit of FIG. 1, according to an embodiment of the present invention.

FIG. 4 illustrates examples of duty cycle detection circuit 111, feedback control circuit 112, and a duty cycle calibration circuit 413, according to an embodiment of the present invention. Duty cycle calibration circuit 413 is a second embodiment of duty cycle calibration circuit 113 shown in FIG. 1.

Duty cycle detection circuit 111 includes resistors 301-302 and capacitors 303-304, as shown in FIGS. 3 and 4. Duty cycle detection circuit 111 and feedback control circuit 112 function as described above with respect to FIG. 3. Duty cycle calibration circuit 413 includes inverter circuits 421-424, p-channel metal oxide semiconductor field-effect transistors (MOSFETs) 431-434, and loading capacitors 441-444. According to various embodiments, inverter circuits 421-424 may be CMOS inverter circuits or other types of inverter circuits. Each of the capacitors 441-444 is coupled to a node at ground voltage VSS. In an alternative embodiment of duty cycle calibration circuit 413, loading capacitors 441-444 are removed, and the parasitic capacitances of inverters 421-424 and transistors 431-434 function as the loading capacitors.

The output signal OUTP of operational amplifier circuit 112 is provided to the gates of p-channel transistors 432 and 433. The output signal OUTN of operational amplifier circuit 112 is provided to the gates of p-channel transistors 431 and 434.

Transistor 431 is coupled between the output of inverter circuit 421 and a node at supply voltage VCC. Transistor 432 is coupled between the output of inverter circuit 422 and a node at supply voltage VCC. Transistor 433 is coupled between the output of inverter circuit 423 and a node at supply voltage VCC. Transistor 434 is coupled between the output of inverter circuit 424 and a node at supply voltage VCC.

Periodic signal CKA2 is provided to an input of inverter circuit 421. Inverter circuit 421 inverts the voltage logic state of periodic signal CKA2 to generate a periodic signal CKAY at its output. Periodic signal CKAY is provided to the input of inverter circuit 422. Inverter circuit 422 inverts the voltage logic state of periodic signal CKAY to generate periodic signal CKA3 at its output.

Periodic signal CKB2 is provided to an input of inverter circuit 423. Inverter circuit 423 inverts the voltage logic state of periodic signal CKB2 to generate a periodic signal CKBY at its output. Periodic signal CKBY is provided to the input of inverter circuit 424. Inverter circuit 424 inverts the voltage logic state of periodic signal CKBY to generate periodic signal CKB3 at its output. Inverters 421-424 buffer their periodic output signals.

Operational amplifier circuit 112 sets the voltages of signals OUTP and OUTN to control the duty cycle of the third differential clock signal (i.e., CKA3−CKB3) in the embodiment of FIG. 4. The duty cycle of the sixth differential clock signal increases in response to an increase in the duty cycle of the first differential clock signal. Duty cycle detection circuit 111 increases differential voltage INP−INN in response to the duty cycle of the sixth differential clock signal increasing. Operational amplifier circuit 112 increases the voltage difference OUTP−OUTN in response to the differential voltage INP−INN increasing.

The currents through transistors 432-433 decrease in response to operational amplifier circuit 112 increasing the voltage of signal OUTP, in the embodiment of FIG. 4. After the current through transistor 432 decreases, the durations of the rising edges of periodic signal CKA3 increase, and the durations of the falling edges of periodic signal CKA3 decrease. After the current through transistor 433 decreases, the durations of the rising edges of periodic signal CKBY increase, and the durations of the falling edges of periodic signal CKBY decrease. In response to these changes in the rising and falling edges of signal CKBY, the durations of the falling edges of periodic signal CKB3 increase, and the durations of the rising edges of periodic signal CKB3 decrease. As a result, increasing voltage OUTP causes the duty cycle of the third differential clock signal (i.e., CKA3−CKB3) to decrease.

The currents through transistors 431 and 434 increase in response to operational amplifier circuit 112 decreasing the voltage of signal OUTN, in the embodiment of FIG. 4. After the current through transistor 431 increases, the durations of the rising edges of periodic signal CKAY decrease, and the durations of the falling edges of periodic signal CKAY increase. In response to these changes in the rising and falling edges of signal CKAY, the durations of the falling edges of periodic signal CKA3 decrease, and the durations of the rising edges of periodic signal CKA3 increase. After the current through transistor 434 increases, the durations of the rising edges of periodic signal CKB3 decrease, and the durations of the falling edges of periodic signal CKB3 increase. As a result, decreasing voltage OUTN causes the duty cycle of the third differential clock signal (i.e., CKA3−CKB3) to decrease.

Circuit 100 decreases the duty cycles of the third, fourth, fifth, and sixth differential clock signals until the duty cycle of the sixth differential clock signal equals 50%. When the duty cycle of the sixth differential clock signal equals 50%, circuit 100 maintains the duty cycles of the third, fourth, fifth, and sixth differential clock signals constant.

The duty cycle of the sixth differential clock signal decreases in response to a decrease in the duty cycle of the first differential clock signal. Duty cycle detection circuit 111 decreases the differential voltage INP−INN in response to the duty cycle of the sixth differential clock signal decreasing. Operational amplifier circuit 112 decreases voltage difference OUTP−OUTN in response to the differential voltage INP−INN decreasing.

The currents through transistors 432-433 increase in response to operational amplifier circuit 112 decreasing the voltage of signal OUTP, in the embodiment of FIG. 4. After the current through transistor 432 increases, the durations of the rising edges of periodic signal CKA3 decrease, and the durations of the falling edges of periodic signal CKA3 increase. After the current through transistor 433 increases, the durations of the rising edges of periodic signal CKBY decrease, and the durations of the falling edges of periodic signal CKBY increase. In response to these changes in the rising and falling edges of signal CKBY, the durations of the falling edges of periodic signal CKB3 decrease, and the durations of the rising edges of periodic signal CKB3 increase. As a result, the duty cycle of the third differential clock signal (i.e., CKA3−CKB3) increases.

The currents through transistors 431 and 434 decrease in response to operational amplifier circuit 112 increasing the voltage of signal OUTN, in the embodiment of FIG. 4. After the current through transistor 431 decreases, the durations of the rising edges of periodic signal CKAY increase, and the durations of the falling edges of periodic signal CKAY decrease. In response to these changes in the rising and falling edges of signal CKAY, the durations of the falling edges of periodic signal CKA3 increase and the durations of the rising edges of periodic signal CKA3 decrease. After the current through transistor 434 decreases, the durations of the rising edges of periodic signal CKB3 increase, and the durations of the falling edges of periodic signal CKB3 decrease. As a result, the duty cycle of the third differential clock signal (i.e., CKA3−CKB3) increases. Circuit 100 increases the duty cycles of the third, fourth, fifth, and sixth differential clock signals until the duty cycle of the sixth differential clock signal equals 50%.

Figure 5:
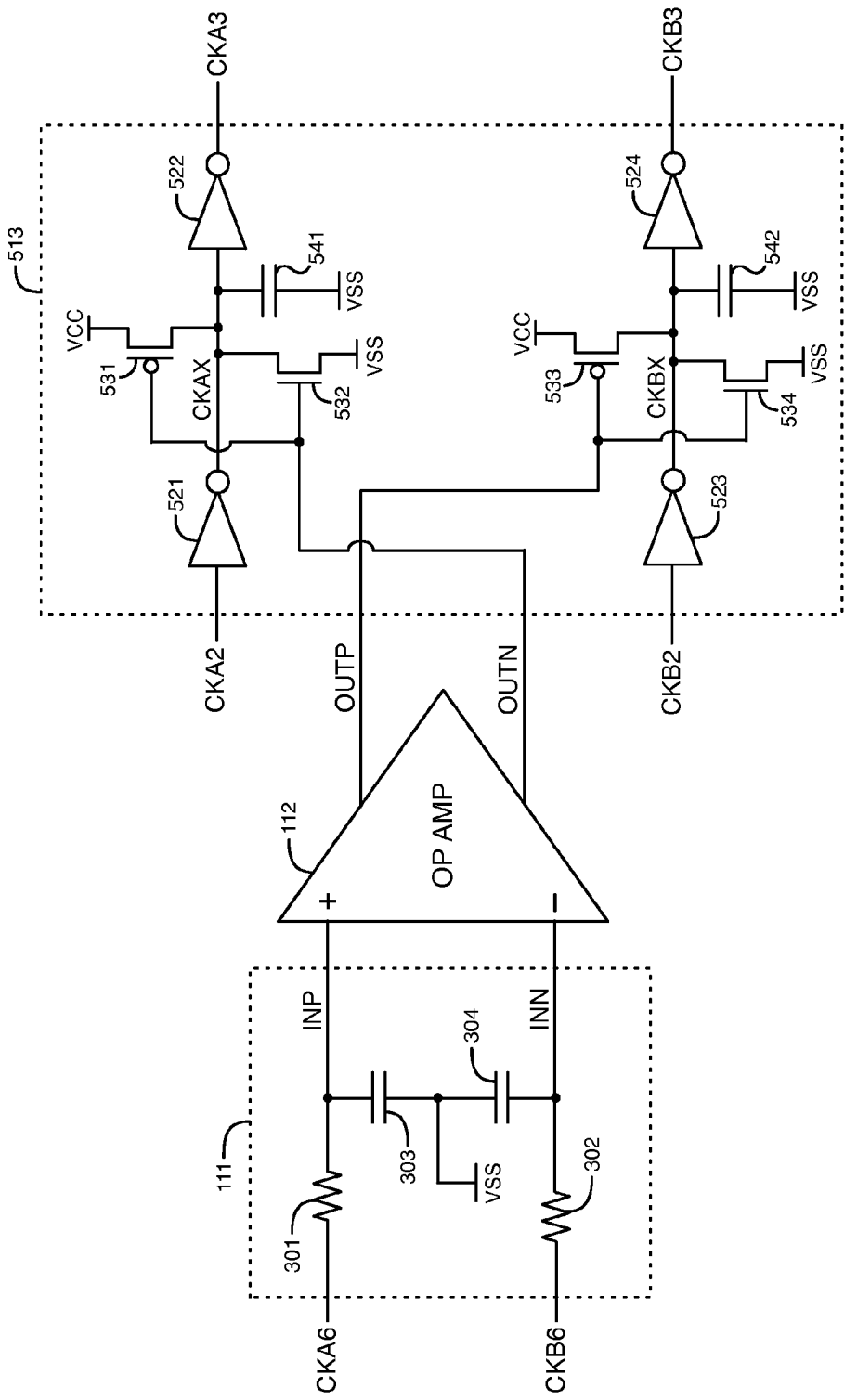
FIG. 5 illustrates an example of the duty cycle detection circuit, an example of the feedback control circuit, and a third example of the duty cycle calibration circuit of FIG. 1, according to an embodiment of the present invention.

FIG. 5 illustrates examples of duty cycle detection circuit 111, feedback control circuit 112, and a duty cycle calibration circuit 513, according to an embodiment of the present invention. Duty cycle calibration circuit 513 is a third embodiment of duty cycle calibration circuit 113 shown in FIG. 1.

Duty cycle detection circuit 111 and feedback control circuit 112 function as described above with respect to FIG. 3. Duty cycle calibration circuit 513 includes inverter circuits 521-524, p-channel MOSFETs 531 and 533, n-channel MOSFETs 532 and 534, and loading capacitors 541-542. According to various embodiments, inverter circuits 521-524 may be CMOS inverter circuits or other types of inverter circuits. Each of the capacitors 541-542 is coupled to a node at a ground voltage VSS. In an alternative embodiment of duty cycle calibration circuit 513, loading capacitors 541-542 are removed, and the parasitic capacitances of inverters 521-524 and transistors 531-534 function as the loading capacitors.

The output signal OUTP of operational amplifier circuit 112 is provided to the gates of transistors 533 and 534. The output signal OUTN of operational amplifier circuit 112 is provided to the gates of transistors 531 and 532.

Transistor 531 is coupled between the output of inverter circuit 521 and a node at supply voltage VCC. Transistor 532 is coupled between the output of inverter circuit 521 and a node at ground voltage VSS. Transistor 533 is coupled between the output of inverter circuit 523 and a node at supply voltage VCC. Transistor 534 is coupled between the output of inverter circuit 523 and a node at ground voltage VSS.

Periodic signal CKA2 is provided to the input of inverter circuit 521. Inverter circuit 521 inverts the logic state of the voltage of periodic signal CKA2 to generate a periodic signal CKAX at its output. Periodic signal CKAX is provided to the input of inverter circuit 522. Inverter circuit 522 inverts the logic state of the voltage of periodic signal CKAX to generate periodic signal CKA3 at its output.

Periodic signal CKB2 is provided to the input of inverter circuit 523. Inverter circuit 523 inverts the logic state of the voltage of periodic signal CKB2 to generate a periodic signal CKBX at its output. Periodic signal CKBX is provided to the input of inverter circuit 524. Inverter circuit 524 inverts the logic state of the voltage of periodic signal CKBX to generate periodic signal CKB3 at its output. Inverters 521-524 buffer their periodic output signals.

Operational amplifier circuit 112 sets the voltages of signals OUTP and OUTN to control the duty cycle of the third differential clock signal (i.e., CKA3−CKB3) in the embodiment of FIG. 5. Duty cycle detection circuit 111 increases differential voltage INP−INN in response to the duty cycle of the sixth differential clock signal increasing. Operational amplifier circuit 112 increases the voltage difference OUTP−OUTN in response to the differential voltage INP−INN increasing.

In response to operational amplifier circuit 112 decreasing the voltage of signal OUTN, the current through transistor 531 increases, and the current through transistor 532 decreases. After the current through transistor 531 increases and the current through transistor 532 decreases, the durations of the rising edges of periodic signal CKAX decrease, and the durations of the falling edges of periodic signal CKAX increase. In response to these changes in the rising and falling edges of signal CKAX, the durations of the falling edges of periodic signal CKA3 decrease, and the durations of the rising edges of periodic signal CKA3 increase.

In response to operational amplifier circuit 112 increasing the voltage of signal OUTP, the current through transistor 533 decreases, and the current through transistor 534 increases.

After the current through transistor 533 decreases and the current through transistor 534 increases, the durations of the rising edges of periodic signal CKBX increase, and the durations of the falling edges of periodic signal CKBX decrease. In response to these changes in the rising and falling edges of signal CKBX, the durations of the falling edges of periodic signal CKB3 increase, and the durations of the rising edges of periodic signal CKB3 decrease. As a result, increasing voltage difference OUTP–OUTN causes the duty cycle of the third differential clock signal (i.e., CKA3–CKB3) to decrease.

Circuit 100 decreases the duty cycles of the third, fourth, fifth, and sixth differential clock signals until the duty cycle of the sixth differential clock signal equals 50%. When the duty cycle of the sixth differential clock signal equals 50%, circuit 100 maintains the duty cycles of the third, fourth, fifth, and sixth differential clock signals constant.

Duty cycle detection circuit 111 decreases the differential voltage INP–INN in response to the duty cycle of the sixth differential clock signal decreasing. Operational amplifier circuit 112 decreases voltage difference OUTP–OUTN in response to the differential voltage INP–INN decreasing.

In response to operational amplifier circuit 112 increasing the voltage of signal OUTN, the current through transistor 531 decreases, and the current through transistor 532 increases. After the current through transistor 531 decreases and the current through transistor 532 increases, the durations of the rising edges of periodic signal CKAX increase, and the durations of the falling edges of periodic signal CKAX decrease. In response to these changes in the rising and falling edges of signal CKAX, the durations of the falling edges of periodic signal CKA3 increase, and the durations of the rising edges of periodic signal CKA3 decrease.

In response to operational amplifier circuit 112 decreasing the voltage of signal OUTP, the current through transistor 533 increases, and the current through transistor 534 decreases. After the current through transistor 533 increases and the current through transistor 534 decreases, the durations of the rising edges of periodic signal CKBX decrease, and the durations of the falling edges of periodic signal CKBX increase. In response to these changes in the rising and falling edges of signal CKBX, the durations of the falling edges of periodic signal CKB3 decrease, and the durations of the rising edges of periodic signal CKB3 increase. As a result, decreasing voltage difference OUTP–OUTN causes the duty cycle of the third differential clock signal (i.e., CKA3–CKB3) to increase. Circuit 100 increases the duty cycles of the third, fourth, fifth, and sixth differential clock signals until the duty cycle of the sixth differential clock signal equals 50%.

Figure 6:
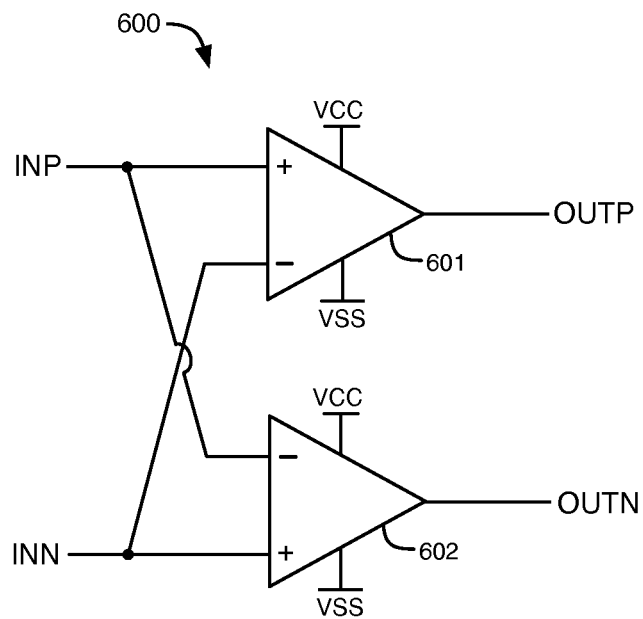
FIG. 6 illustrates an example of a differential operational amplifier circuit, according to an embodiment of the present invention.

FIG. 6 illustrates an embodiment of a differential operational amplifier circuit 600, according to an embodiment of the present invention. In some embodiments of circuit 100 shown in FIG. 1, feedback control circuit 112 includes differential operational amplifier circuit 600. Differential operational amplifier circuit 600 includes amplifier circuits 601 and 602. Input signal INP is provided to the non-inverting (+) input of amplifier circuit 601 and to the inverting (−) input of amplifier circuit 602. Input signal INN is provided to the inverting (−) input of amplifier circuit 601 and to the non-inverting (+) input of amplifier circuit 602. Amplifier 601 amplifies the voltage difference between input signals INP and INN (i.e., INP–INN) to generate the voltage of output signal OUTP. Amplifier circuit 602 amplifies the voltage difference between input signals INN and INP (i.e., INN–INP) to generate the voltage of output signal OUTN.

Figure 7:
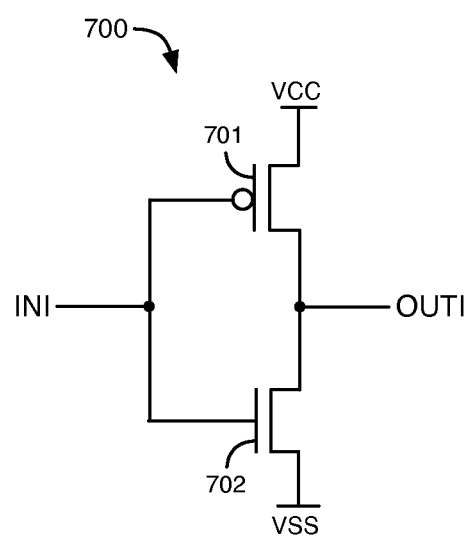
FIG. 7 illustrates an example of a CMOS inverter circuit, according to an embodiment of the present invention.

FIG. 7 illustrates an example of a CMOS inverter circuit 700, according to an embodiment of the present invention. CMOS inverter circuit 700 is an example of each of the inverter circuits 201-206, 321-324, 421-424, and 521-524 shown in FIGS. 2-5. CMOS inverter circuit 700 includes p-channel MOSFET 701 and n-channel MOSFET 702. Transistors 701 and 702 are coupled in series between a node at supply voltage VCC and a node at ground voltage VSS. Inverter 700 inverts the logic state of input voltage INI to generate the logic state of output voltage OUTI.

In embodiments of duty cycle calibration circuit 313 where inverter circuits 321-324 are CMOS inverters, the n-channel transistor in inverter circuit 321 is coupled in parallel with n-channel transistor 331, the n-channel transistor in inverter circuit 322 is coupled in parallel with n-channel transistor 332, the n-channel transistor in inverter circuit 323 is coupled in parallel with n-channel transistor 333, and the n-channel transistor in inverter circuit 324 is coupled in parallel with n-channel transistor 334.

In embodiments of duty cycle calibration circuit 413 where inverter circuits 421-424 are CMOS inverters, the p-channel transistor in inverter circuit 421 is coupled in parallel with p-channel transistor 431, the p-channel transistor in inverter circuit 422 is coupled in parallel with p-channel transistor 432, the p-channel transistor in inverter circuit 423 is coupled in parallel with p-channel transistor 433, and the p-channel transistor in inverter circuit 424 is coupled in parallel with p-channel transistor 434.

In embodiments of duty cycle calibration circuit 513 where inverter circuits 521-524 are CMOS inverters, the n-channel transistor in inverter circuit 521 is coupled in parallel with n-channel transistor 532, the p-channel transistor in inverter circuit 521 is coupled in parallel with p-channel transistor 531, the n-channel transistor in inverter circuit 523 is coupled in parallel with n-channel transistor 534, and the p-channel transistor in inverter circuit 523 is coupled in parallel with p-channel transistor 533.

Figure 8:
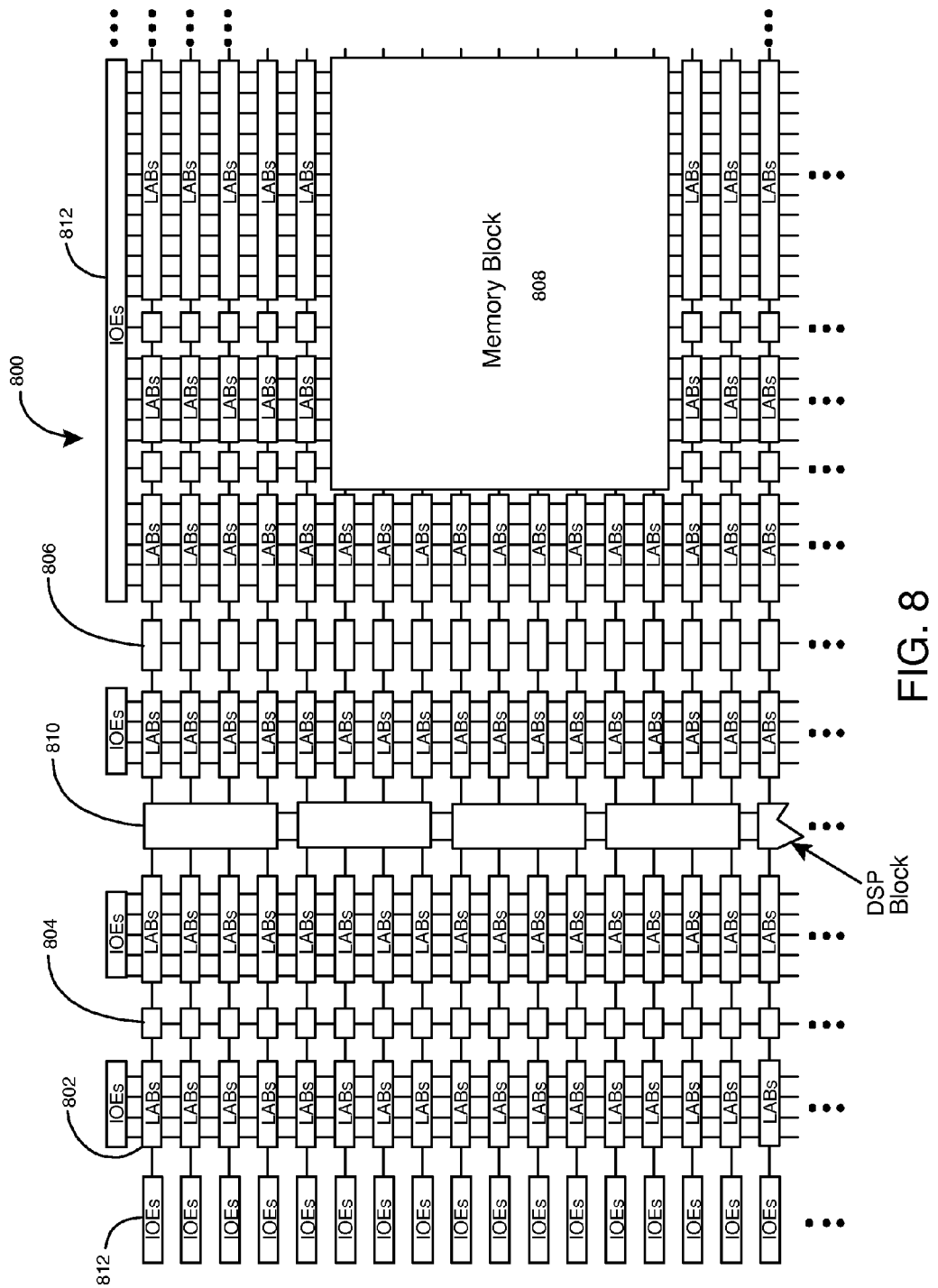
FIG. 8 is a simplified partial block diagram of a field programmable gate array (FPGA) that can include aspects of the present invention.

FIG. 8 is a simplified partial block diagram of a field programmable gate array (FPGA) 800 that can include embodiments of the present invention. FPGA 800 is merely one example of an integrated circuit that can include features of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), application specific integrated circuits (ASICs), memory integrated circuits, central processing units, microprocessors, analog integrated circuits, etc.

FPGA 800 includes a two-dimensional array of programmable logic array blocks (or LABs) 802 that are interconnected by a network of column and row interconnect conductors of varying length and speed. LABs 802 include multiple (e.g., 10) logic elements (or LEs).

A logic element (LE) is a programmable logic circuit block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 800 also includes a distributed memory structure including random access memory (RAM) blocks of varying sizes provided throughout the array. The RAM blocks include, for example, blocks 804, blocks 806, and block 808. These memory blocks can also include shift registers and first-in-first-out (FIFO) buffers.

FPGA 800 further includes digital signal processing (DSP) blocks 810 that can implement, for example, multipliers with add or subtract features. Input/output elements (IOEs) 812 support numerous single-ended and differential input/output standards. IOEs 812 include input and output buffers that are coupled to pins of the integrated circuit. The pins are external terminals of the FPGA die that can be used to route, for example, input signals, output signals, and supply voltages between the FPGA and one or more external devices. FPGA 800 is described herein for illustrative purposes. Embodiments of the present invention can be implemented in many different types of integrated circuits.

Figure 9:
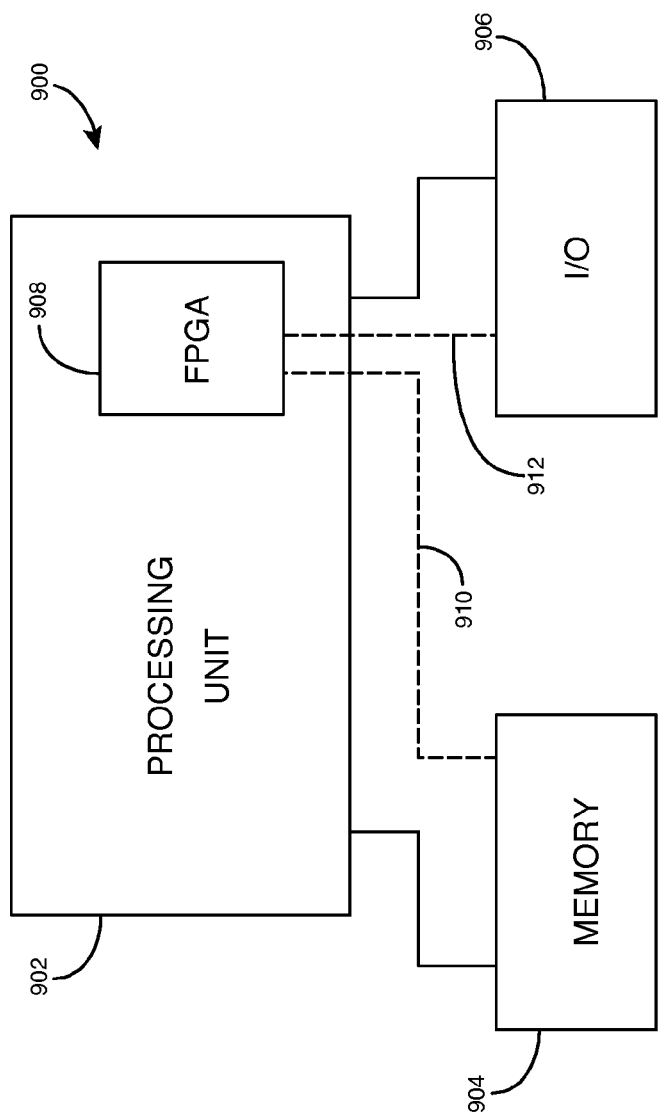
FIG. 9 shows a block diagram of an exemplary digital system that can embody techniques of the present invention.

Embodiments of the present invention can also be implemented in a system that has an FPGA as one of several components. FIG. 9 shows a block diagram of an exemplary digital system 900 that can embody techniques of the present invention. System 900 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 900 can be provided on a single board, on multiple boards, or within multiple enclosures.

System 900 includes a processing unit 902, a memory unit 904, and an input/output (I/O) unit 906 interconnected together by one or more buses. According to this exemplary embodiment, an FPGA 908 is embedded in processing unit 902. FPGA 908 can serve many different purposes within the system of FIG. 9. FPGA 908 can, for example, be a logical building block of processing unit 902, supporting its internal and external operations. FPGA 908 is programmed to implement the logical functions necessary to carry on its particular role in system operation. FPGA 908 can be specially coupled to memory 904 through connection 910 and to I/O unit 906 through connection 912.

Processing unit 902 can direct data to an appropriate system component for processing or storage, execute a program stored in memory 904, receive and transmit data via I/O unit 906, or other similar functions. Processing unit 902 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 908 can control the logical operations of the system. As another example, FPGA 908 acts as a reconfigurable processor that can be reprogrammed as needed to handle a particular computing task. Alternatively, FPGA 908 can itself include an embedded microprocessor. Memory unit 904 can be a random access memory (RAM), read only memory (ROM), fixed or flexible disk media, flash memory, tape, or any other storage means, or any combination of these storage means.

The foregoing description of the exemplary embodiments of the present invention has been presented for the purposes of illustration and description. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. A circuit comprising:
a duty cycle calibration circuit to generate a first clock signal based on a second clock signal using a first inverter and a first transistor, wherein the first transistor is coupled in parallel with a second transistor in the first inverter;
a duty cycle detection circuit to generate a first voltage signal that varies based on changes in a duty cycle of the first clock signal; and
a feedback control circuit to generate a first control signal based on the first voltage signal, wherein the duty cycle calibration circuit controls the duty cycle of the first clock signal based on the first control signal controlling a current through the first transistor.

2. The circuit of claim 1 further comprising:
a first clock buffer circuit to generate a third clock signal based on the first clock signal; and
a second clock buffer circuit to generate a fourth clock signal based on the third clock signal, wherein the duty cycle detection circuit causes the first voltage signal to be indicative of a duty cycle of the fourth clock signal.

3. The circuit of claim 2, wherein each of the first, the second, the third, and the fourth clock signals is a differential clock signal.

4. The circuit of claim 3, wherein each of the first and the second clock buffer circuits comprises a first inverter to generate a first periodic signal, a second inverter to generate a second periodic signal, and third and fourth cross-coupled inverters that are coupled between inputs of the first and the second inverters.

5. The circuit of claim 1, wherein the duty cycle calibration circuit generates the first clock signal based on the second clock signal using the first inverter, a second inverter, the first transistor, and a third transistor, wherein the third transistor is coupled in parallel with a fourth transistor in the second inverter, and wherein a current through the third transistor varies based on changes in the first control signal.

6. The circuit of claim 1, wherein the first clock signal is a differential clock signal comprising first and second periodic signals, wherein the duty cycle detection circuit generates the first voltage signal and a second voltage signal based on the duty cycle of the first clock signal, and wherein the feedback control circuit generates the first control signal and a second control signal based on the first and the second voltage signals.

7. The circuit of claim 6, wherein the duty cycle calibration circuit adjusts a duty cycle of the first periodic signal based on the first control signal varying a current through the first transistor, wherein the duty cycle calibration circuit comprises a third transistor coupled in parallel with a fourth transistor in a second inverter, and wherein the duty cycle calibration circuit adjusts a duty cycle of the second periodic signal based on the second control signal varying a current through the third transistor.

8. The circuit of claim 7, wherein a fifth transistor is coupled in parallel with a sixth transistor in the first inverter, wherein a current through the fifth transistor varies based on changes in the first control signal, wherein a seventh transistor is coupled in parallel with an eighth transistor in the second inverter, and wherein a current through the seventh transistor varies based on changes in the second control signal.

9. The circuit of claim 7, wherein the duty cycle calibration circuit generates the first periodic signal using a third inverter that is coupled to an output of the first inverter, wherein the duty cycle calibration circuit generates the second periodic signal using a fourth inverter that is coupled to an output of the second inverter, wherein a fifth transistor is coupled in parallel with a sixth transistor in the third inverter, wherein a current through the fifth transistor varies based on changes in the second control signal, wherein a seventh transistor is coupled in parallel with an eighth transistor in the fourth inverter, and wherein a current through the seventh transistor varies based on changes in the first control signal.

10. The circuit of claim 1, wherein the duty cycle detection circuit comprises a differential low pass filter circuit, and wherein the feedback control circuit comprises a differential amplifier circuit.

11. A circuit comprising:
a duty cycle calibration circuit to generate a first differential clock signal based on a second differential clock signal;
a duty cycle detection circuit to generate first and second voltage signals that vary based on changes in a duty cycle of the first differential clock signal; and
an amplifier circuit to amplify a difference between the first and the second voltage signals to generate first and second control signals, wherein the duty cycle calibration circuit controls the duty cycle of the first differential clock signal based on the first and the second control signals,
wherein the duty cycle calibration circuit comprises a first transistor and a buffer circuit comprising a second transistor, wherein the first transistor is coupled in parallel with the second transistor, and wherein a current through the first transistor is controlled by the first control signal.

12. The circuit of claim 11, wherein the buffer circuit is a first inverter circuit, and wherein the first inverter circuit further comprises a third transistor coupled to the second transistor.

13. The circuit of claim 12, wherein the duty cycle calibration circuit further comprises a second inverter circuit and a fourth transistor, wherein the second inverter circuit comprises fifth and sixth transistors, wherein the fourth transistor is coupled in parallel with the fifth transistor, and wherein the second control signal controls a current through the fourth transistor.

14. The circuit of claim 13, wherein the duty cycle calibration circuit further comprises third and fourth inverter circuits and seventh and eighth transistors, wherein the third inverter circuit is coupled to an output of the first inverter circuit, wherein the fourth inverter circuit is coupled to an output of the second inverter circuit, wherein the seventh transistor is coupled to an output of the third inverter circuit, wherein the eighth transistor is coupled to an output of the fourth inverter circuit, wherein the second control signal controls a current through the seventh transistor, and wherein the first control signal controls a current through the eighth transistor.

15. The circuit of claim 14, wherein the third inverter circuit comprises ninth and tenth transistors, wherein the seventh transistor is coupled in parallel with the ninth transistor, wherein the fourth inverter circuit comprises eleventh and twelfth transistors, and wherein the eighth transistor is coupled in parallel with the eleventh transistor.

16. The circuit of claim 13, wherein a seventh transistor is coupled in parallel with the third transistor, wherein the first control signal controls a current through the seventh transistor, wherein an eighth transistor is coupled in parallel with the sixth transistor, and wherein the second control signal controls a current through the eighth transistor.

17. A circuit comprising:
a duty cycle calibration circuit to generate a first differential clock signal based on a second differential clock signal;
a duty cycle detection circuit to generate first and second voltage signals that vary based on changes in a duty cycle of the first differential clock signal;
an amplifier circuit to amplify a difference between the first and the second voltage signals to generate first and second control signals, the duty cycle calibration circuit to control the duty cycle of the first differential clock signal based on the first and the second control signals; and
a first differential clock buffer circuit to generate first and second periodic signals that indicate a third differential clock signal, the first differential clock buffer circuit to generate the first periodic signal based on third and fourth periodic signals that indicate the first differential clock signal, the first differential clock buffer circuit to generate the second periodic signal based on the third and the fourth periodic signals, and the duty cycle detection circuit to cause the first and the second voltage signals to vary based on changes in a duty cycle of the third differential clock signal.

18. The circuit of claim 17 further comprising:
a second differential clock buffer circuit to generate fifth and sixth periodic signals that indicate a fourth differential clock signal, the second differential clock buffer circuit to generate the fifth periodic signal based on the first and the second periodic signals, the second differential clock buffer circuit to generate the sixth periodic signal based on the first and the second periodic signals, and the duty cycle detection circuit to cause the first and the second voltage signals to indicate a duty cycle of the fourth differential clock signal.

19. The circuit of claim 18, wherein each of the first and the second differential clock buffer circuits comprises first and second inverters coupled in series, third and fourth inverters coupled in series, and fifth and sixth cross-coupled inverters, wherein the fifth inverter is coupled to each of the first, the second, the third, and the fourth inverters, and wherein the sixth inverter is coupled to each of the first, the second, the third, and the fourth inverters.

20. A method comprising:
generating a first clock signal based on a second clock signal using a first inverter circuit and a first transistor, wherein the first transistor is coupled in parallel with a second transistor in the first inverter circuit;
generating a first voltage signal that varies based on changes in a duty cycle of the first clock signal; and
generating a first control signal based on the first voltage signal that controls a current through the first transistor to control the duty cycle of the first clock signal.

21. The method of claim 20, wherein the first clock signal is a differential clock signal, wherein generating a first voltage signal that varies based on changes in a duty cycle of the first clock signal comprises generating the first voltage signal and a second voltage signal that vary based on changes in the duty cycle of the first clock signal, and wherein generating a first control signal based on the first voltage signal comprises amplifying a difference between the first and the second voltage signals to generate the first control signal and a second control signal that control the duty cycle of the first clock signal.

22. The method of claim 21, wherein generating a first clock signal based on a second clock signal using a first inverter circuit and a first transistor further comprises generating the first clock signal using a second inverter circuit and a third transistor, wherein the third transistor is coupled in parallel with a fourth transistor in the second inverter circuit, and wherein the second control signal controls a current through the third transistor.

23. The method of claim 22, wherein generating a first clock signal based on a second clock signal using a first inverter circuit and a first transistor further comprises generating a first periodic signal using a third inverter circuit that is coupled to an output of the first inverter circuit, and generating a second periodic signal using a fourth inverter circuit that is coupled to an output of the second inverter circuit, and wherein the first clock signal is indicated by the first and the second periodic signals.

24. The method of claim 23, wherein generating a first clock signal based on a second clock signal using a first inverter circuit and a first transistor further comprises controlling a current through a fifth transistor using the second control signal, and controlling a current through a sixth transistor using the first control signal, wherein the fifth transistor is coupled in parallel with a seventh transistor in the third inverter circuit, and wherein the sixth transistor is coupled in parallel with an eighth transistor in the fourth inverter circuit.

25. A method comprising:
generating a first differential clock signal based on a second differential clock signal using a duty cycle calibration circuit;
generating first and second voltage signals that vary based on changes in a duty cycle of the first differential clock signal using a duty cycle detection circuit; and
amplifying a difference between the first and the second voltage signals to generate first and second control signals that control the duty cycle of the first differential clock signal using an amplifier circuit, wherein the first and the second control signals are provided to the duty cycle calibration circuit, wherein the duty cycle calibration circuit comprises a first transistor and a buffer circuit comprising a second transistor, wherein the first transistor is coupled in parallel with the second transistor; and
controlling a current through the first transistor using the first control signal.

26. A method comprising:
generating a first differential clock signal based on a second differential clock signal using a duty cycle calibration circuit;
generating first and second voltage signals that vary based on changes in a duty cycle of a third differential clock signal using a duty cycle detection circuit;
amplifying a difference between the first and the second voltage signals using an amplifier circuit to generate first and second control signals that control a duty cycle of the first differential clock signal, wherein the first and the second control signals are provided to the duty cycle calibration circuit;
generating a first periodic signal based on second and third periodic signals that indicate the first differential clock signal using a differential clock buffer circuit; and
generating a fourth periodic signal based on the second and the third periodic signals using the differential clock buffer circuit, wherein the first and the fourth periodic signals indicate the third differential clock signal.

* * * * *